(12) United States Patent
Iijima et al.

(10) Patent No.: US 8,249,217 B2
(45) Date of Patent: Aug. 21, 2012

(54) INVERTER DEVICE AND X-RAY HIGH-VOLTAGE DEVICE USING THE INVERTER DEVICE

(75) Inventors: Hirokazu Iijima, Tokyo (JP); Takuya Domoto, Tokyo (JP); Takayuki Masaki, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 281 days.

(21) Appl. No.: 12/744,418

(22) PCT Filed: Dec. 1, 2008

(86) PCT No.: PCT/JP2008/071788
§ 371 (c)(1),
(2), (4) Date: May 24, 2010

(87) PCT Pub. No.: WO2009/072460
PCT Pub. Date: Jun. 11, 2009

(65) Prior Publication Data
US 2010/0254515 A1    Oct. 7, 2010

(30) Foreign Application Priority Data
Dec. 3, 2007    (JP) .................................. 2007-311893

(51) Int. Cl.
*H05G 1/10* (2006.01)

(52) U.S. Cl. ......................................... 378/101; 378/104
(58) Field of Classification Search .................. 378/101, 378/104, 105, 107, 118, 207
See application file for complete search history.

(56) References Cited

FOREIGN PATENT DOCUMENTS

| JP | 05-062792 | 3/1993 |
|---|---|---|
| JP | 6-096894 | 4/1994 |
| JP | 09-117066 | 5/1997 |
| JP | 10-094269 | 4/1998 |
| JP | 2004-312907 | 11/2004 |
| JP | 2004-357437 | 12/2004 |
| JP | 2006-054943 | 2/2006 |

*Primary Examiner* — Jurie Yun
(74) *Attorney, Agent, or Firm* — Brundidge & Stanger, P.C.

(57) ABSTRACT

There is provided an inverter device that can detect short-circuit of a switching element of an inverter circuit even under a load condition that a PWM driving signal is very small. The inverter device is provided with means for independently supplying a short-circuit detecting PWM driving signal to respective switching elements S1 to S4 at different timings before the inverter circuit 21 supplies a PWM driving signal for supplying power to a high voltage generating device 31, successively turning on the respective switching elements S1 to S4 with the short-circuit detecting PWM driving signal, detecting on-voltages of the switching elements S1 to S4 which are connected to the turned-on switching elements S1 to S4 in series, and detecting overcurrent or short-circuit states of the switching elements S1 to S4.

7 Claims, 8 Drawing Sheets

INVERTER DEVICE AND X-RAY HIGH-VOLTAGE DEVICE USING THE INVERTER DEVICE

TECHNICAL FIELD

The present invention relates to an inverter device and an X-ray high voltage device using the inverter device, and particularly to an inverter device that can protect a switching element constituting the inverter device from overcurrent, and an X-ray high voltage device using the inverter device.

X-ray CT apparatuses have been promoted to perform multi-slicing for the purpose of shortening an examination time, increase a scanning speed for the purpose of application to moving organs such as heart, and enlarge an scanning range.

In the X-ray CT apparatus, an X-ray high voltage device for applying a high voltage to an X-ray tube is mounted on a scanner rotary disk. The rotational speed of the scanner rotary disk of the X-ray CT apparatus has been promoted to be increased. Therefore, the X-ray high voltage device mounted on the scanner rotary disk has been required to be compact in size and light in weight.

In order to implement the compact size and light weight, an inverter type X-ray high voltage device has been adopted for X-ray high voltage devices to which the compact size and light weight is required.

A full bridge inverter circuit is used as the inverter circuit as described above because power to be handled is large. An IGBT (Insulated Gate Bipolar Transistor) module is used as each switching element of the full bridge inverter circuit constituting the inverter circuit. IGBT is a bipolar transistor in which MOSFET is installed in a gate portion. It is a self arc-extinguishing type semiconductor element which can be driven with a voltage between a gate and an emitter and turned on/off in response to an input signal, and perform a high-speed switching operation of large power.

A method in which overcurrent or short-circuit trouble of a switching element is detected by utilizing the fact that an ON voltage occurring due to flow of current through an on-resistor when the switching element is turned on is abnormally large when overcurrent or short-circuit current flows (for example, see Japanese Patent Document 1) has been known as a method of detecting and protecting overcurrent or short-circuit trouble of a switching element represented by an IGBT module.

According to this patent document 1, an on-voltage abnormality detecting circuit for detecting overcurrent or short-circuit is operated with providing a time period during which the on-voltage abnormality detecting circuit for detecting overcurrent or short-circuit is masked for a fixed time from occurrence of an on-signal caused by a PWM driving signal.

Patent Document 1: JP-A-10-94269

DISCLOSURE OF THE INVENTION

Problem to be Solved by the Invention

When a device has a broad load range as in the case of the X-ray high voltage device, the device is designed so as to obtain a sufficient output for the maximum load. Therefore, the inverter is switched with a very narrow PWM driving signal under the minimum load.

Accordingly, in the Patent Document 1, protection cannot be performed by a protecting unit based on detection of abnormality of the on-voltage under an output condition that the PWM driving signal is shorter than the mask time for the on-voltage abnormality detection.

That is, with respect to the conventional PWM driving signal for the switching element, it starts from a very narrow pulse width (PWM width), and when a tube voltage output is small as compared with a tube voltage set value, the PWM width thereof is gradually broader, so that it operates stably with the PWM width at which the tube voltage output is coincident with the tube voltage set value.

At this time, for example, under a condition that one switching element suffers short-circuit trouble, when a switching element which is connected to the former switching element in series is turned on, short-circuit current which short-circuits a DC power source flows to the two serially connected switching elements. When the PWM driving signal of the serially connected switching element gradually broadens the PWM width thereof and also the on-time of the PWM driving signal is shorter than the mask time in a dead time compensating circuit during the overall time period, there is a problem that the PWM driving signal of the serially connected switching element is turned off before abnormality is detected, and thus short-circuit detection cannot be performed.

The above operation is executed repetitively, whereby short-circuit current repetitively flows through the two serially connected switching elements. Therefore, there is a problem that during this time period, any of the two serially connected switching elements reaches thermal destruction and thus the device cannot be stopped safely.

An object of the present invention is to provide an inverter device that can detect short-circuit even under a load condition that a PWM driving signal is very small.

Furthermore, an object of the present invention is to provide an X-ray high voltage device using an inverter device having high reliability to a very broad load range by applying to an X-ray high voltage device an inverter device that can detect short-circuit even under a load condition that a PWM driving signal is very small.

Means of Solving the Problem

An inverter device according to the present invention which is implemented to solve the foregoing problem includes an inverter circuit that is constructed by plural switching elements, receives a PWM driving signal to be supplied to the switching elements to convert a DC voltage supplied from a DC power source to a high-frequency AC voltage and outputs the thus-converted high-frequency AC voltage; and control means for outputting the PWM driving signal to be supplied to each of the switching elements and controlling the output of the PWM driving signal, and further includes means for supplying a PWM driving signal for detecting short-circuit of each switching element to each switching element before the inverter circuit receives a PWM driving signal for supplying power to a load, and means for detecting an on-voltage of a switching element which is serially connected to each switching element turned on when the switching element concerned is turned on by the short-circuit detecting PWM driving signal, thereby detecting an overcurrent or short-circuit state of the switching element.

An X-ray high voltage device using an inverter device according to the present invention which is implemented to solve the foregoing problem includes a DC power source, an inverter device, a high voltage generating device, a rectifier and a smoothing capacitor, wherein the DC voltage supplied from the DC power source is converted to a high-frequency AC voltage by the inverter device to output the thus-converted high-frequency AC voltage, the high-frequency AC voltage is converted to a high-frequency high voltage by the high voltage generating device to output the thus-converted high-frequency high voltage, the high-frequency AC voltage is rectified by the rectifier and further smoothened by the smoothing capacitor to supply the rectified and smoothened voltage as a tube voltage to an X-ray tube, and the inverter device is constructed by the inverter device described above.

Effect of the Invention

According to the inverter device of the present invention, short-circuit trouble can be detected even under a small load condition that stationary operation is performed with a very narrow PWM driving signal.

Furthermore, according to the X-ray high voltage device using the inverter device of the present invention, abnormality such as short-circuit of switching elements constituting the inverter circuit can be detected.

DESCRIPTION OF REFERENCE NUMERAL

6 X-ray tube, 11, 12 DC power source, 21, 22 inverter circuit, 24 PWM driving signal generating device, 26 on-voltage detecting circuit, 31, 32 high-voltage generating device, 41 rectifier, 51 smoothing capacitor, 70 alarm, 100 CPU

BEST MODES FOR CARRYING OUT THE INVENTION

Best modes for carrying out the invention will be described with reference to FIGS. 1 to 7.

Figure 1:
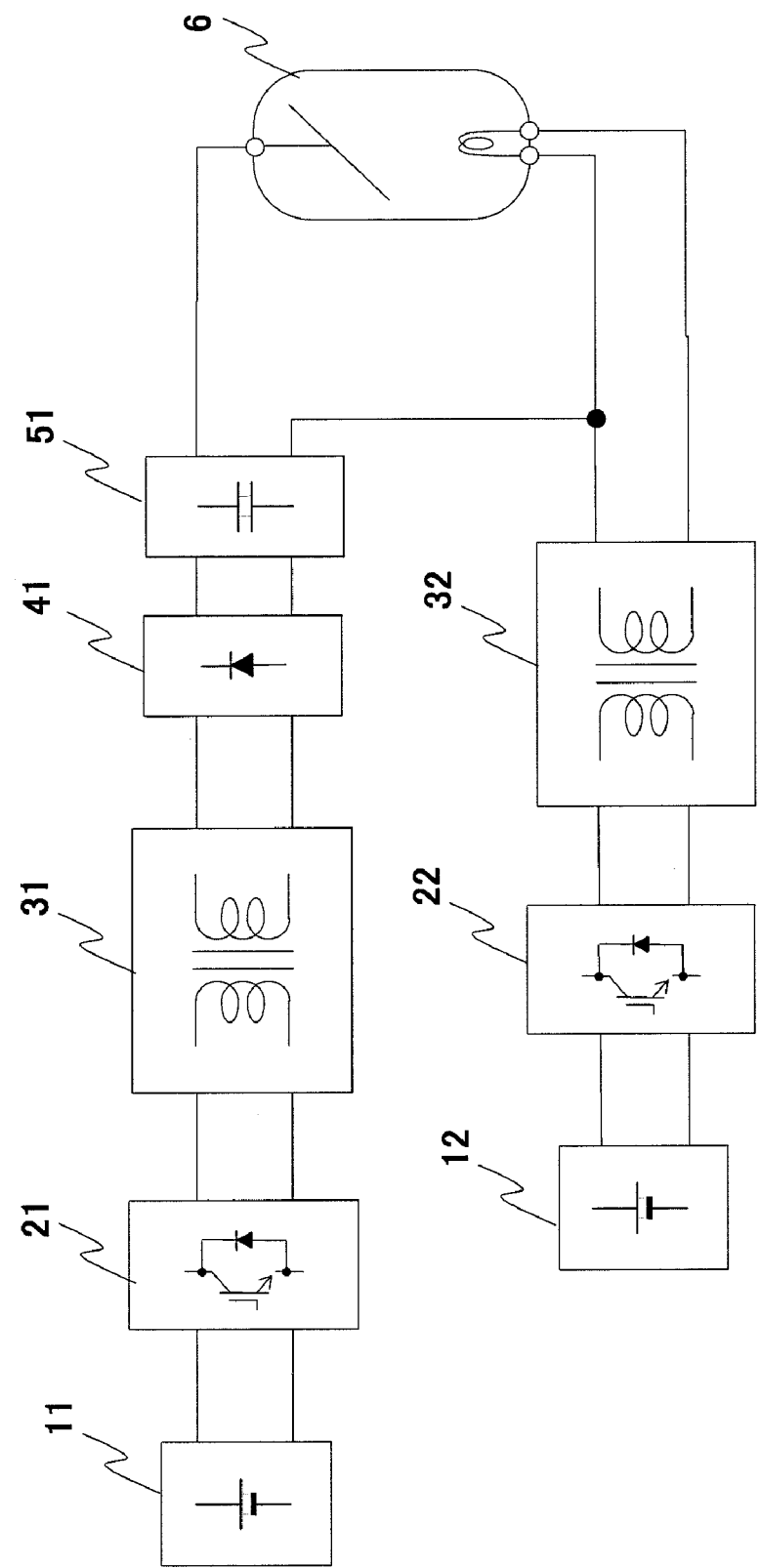
FIG. 1 is a block diagram showing an inverter type X-ray high voltage device according to the present invention.

FIG. 1 shows the construction of an inverter type X-ray high voltage device according to the present invention.

In FIG. 1, the inverter type X-ray high voltage device converts a DC voltage supplied from a DC power source 11 to a high-frequency AC voltage by an inverter circuit 21. The inverter type X-ray high voltage device applies the high-frequency AC voltage generated by the inverter circuit 21 to a high voltage generating device 31. When the high-frequency AC voltage is applied to the high voltage generating device 31, a high-frequency high voltage output from the high voltage generating device 31 is rectified by a rectifier 41, further smoothened by a smoothing capacitor 51 and then applied to an X-ray tube 6.

In the inverter type X-ray high voltage device shown in FIG. 1, the high-voltage generating device 31 can be configured to be compact in size and light in weight by adopting the inverter circuit 21 as described above.

The X-ray tube 6 shown in FIG. 1 has a filament, and a circuit for supplying power to heat the filament (a filament heating circuit of the X-ray tube) is provided separately from a circuit for applying the tube voltage. The filament heating circuit of the X-ray tube is constructed as a part of the inverter type X-ray high voltage device shown in FIG. 1.

The filament heating circuit of the X-ray tube is constructed by a DC power source 12, an inverter circuit 22 and a high voltage generating device 32 as shown in FIG. 1. As described above, the inverter circuit is also used in the filament heating circuit of the X-ray tube. Furthermore, an inverter circuit is also used in an anode rotational driving circuit (not shown) of the X-ray tube.

The inverter type X-ray high voltage device shown in FIG. 1 converts a DC voltage supplied from the DC power source 11 to a high-frequency AC voltage by the inverter circuit 21, and applies a tube voltage to the X-ray tube 6.

Figure 2:
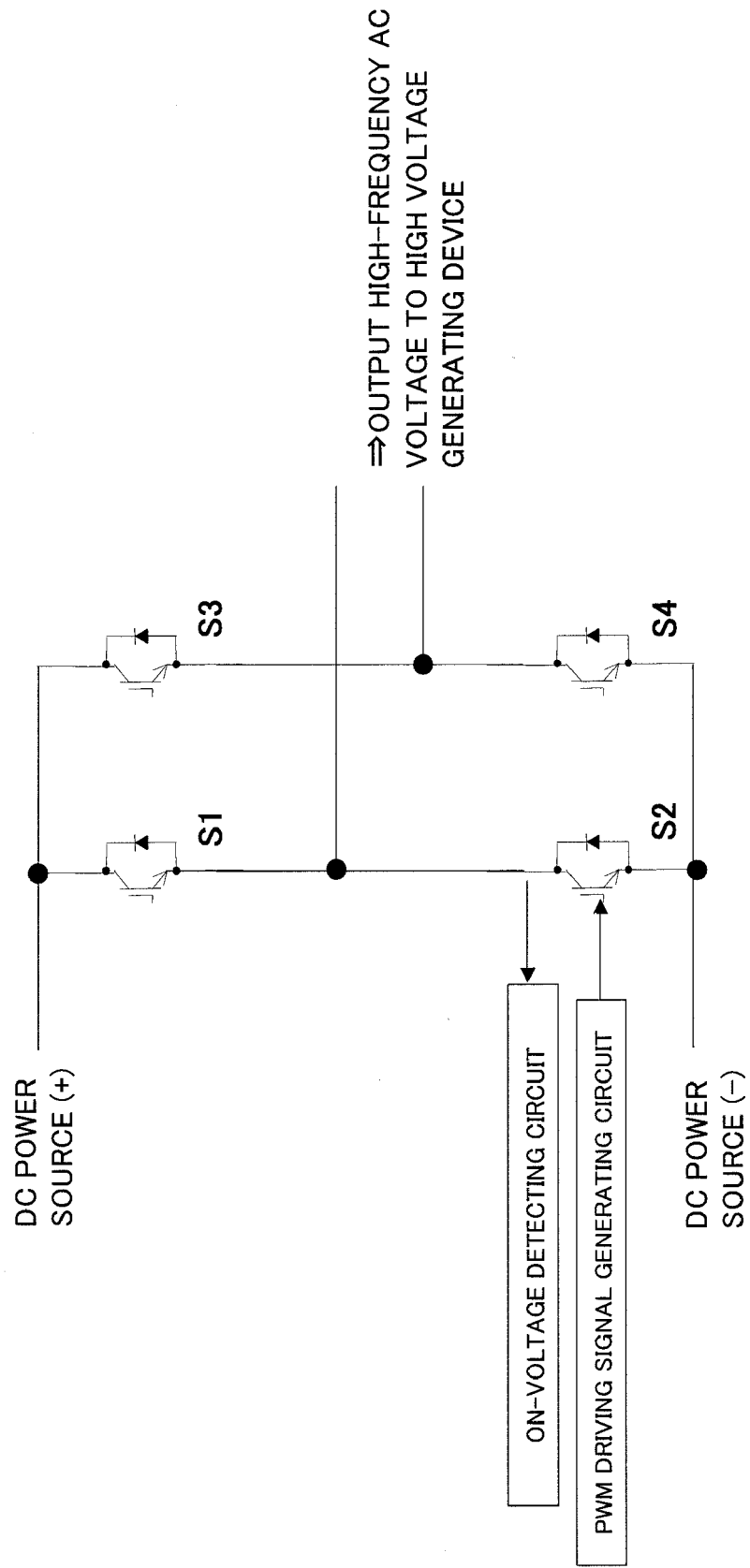
FIG. 2 is a diagram showing a full bridge inverter circuit constituting an inverter circuit shown in FIG. 1.

In an X-ray CT apparatus, a full bridge inverter circuit shown in FIG. 2 is used as the inverter circuit for generating the tube voltage as described above because power to be handled is large in connection with increase of scan speed and enlargement of an scanning range as described above.

The full bridge inverter circuit constituting the inverter circuit 21 is shown in FIG. 2.

In FIG. 2, switching elements S1 to S4 are shown as an IGBT (Insulated Gate Bipolar Transistor) module. IGBT is a bipolar transistor in which MOSFET is installed in a gate portion, and it is a self arc-extinguishing type semiconductor element which can be driven with a voltage between a gate and an emitter and turned on/off with an input signal, and perform a high-speed switching operation of large power.

A PWM driving signal generating circuit 24 for inputting a driving signal and an on-voltage detecting circuit 26 are connected to the gate of each of the switching elements S1 to S4, and the PWM driving signal generating circuit 24 and the on-voltage detecting circuit 26 are connected to CPU 100. The on-voltage detecting circuit 26 is a circuit for detecting an inter-terminal voltage of the switching element, a well-known circuit may be used.

In these switching elements S1 to S4, the switching element S1 and the switching element S2 are connected to each other in series, and the switching element S3 and the switching element S4 are connected to each other in series. A primary coil of the high voltage generating device 31 is connected to the connection point between the switching element S1 and the switching element S2 and the connection point between the switching element S3 and the switching element S4.

When the switching element S1 and the switching element S4 are simultaneously turned on in response to a voltage input from the DC power source 11 under the connection state as described above, a plus voltage is output to the high voltage generating device 31 serving as a load. Furthermore, when the switching element S2 and the switching element S3 are simultaneously turned on in response to a voltage input from the DC power source, a minus voltage is output to the high voltage generating device 31 as a load.

PWM control may be used as a method of controlling the output of the inverter circuit 21 (22) constructed by the switching elements S1, S2, S3 and S4. The PWM control is a method of controlling the output power of the inverter by controlling the time width of a pulse-shaped driving signal for simultaneously turning on the switching element S1 and the switching element S4 or the switching element S2 and the switching element S3.

Figure 3:
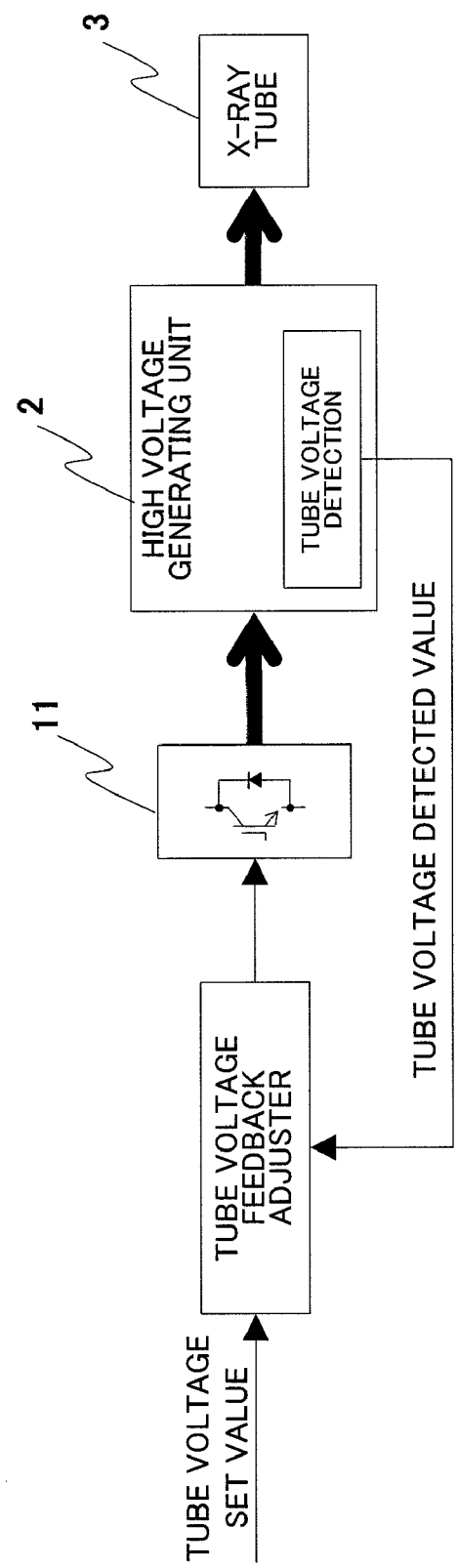
FIG. 3 is a block diagram showing tube voltage control in the inverter type X-ray high voltage device shown in FIG. 1.

FIG. 3 is a block diagram showing the tube voltage control of the inverter type X-ray high voltage device for applying to the high voltage generating device 31 a high-frequency AC voltage output from the inverter circuit 21 constructed by the full bridge inverter circuit as described above, and controlling the tube voltage applied to the X-ray tube 6.

In FIG. 3, the tube voltage is detected in a unit 2 containing the high voltage generating device 31, a tube voltage detection value and a tube voltage set value are compared with each other in a tube voltage feedback adjusting unit 101 of CPU 100, the time for turning on the switching elements S1 to S4 of the inverter circuit 21 is varied, thereby controlling the tube voltage.

First Embodiment

Figure 4:
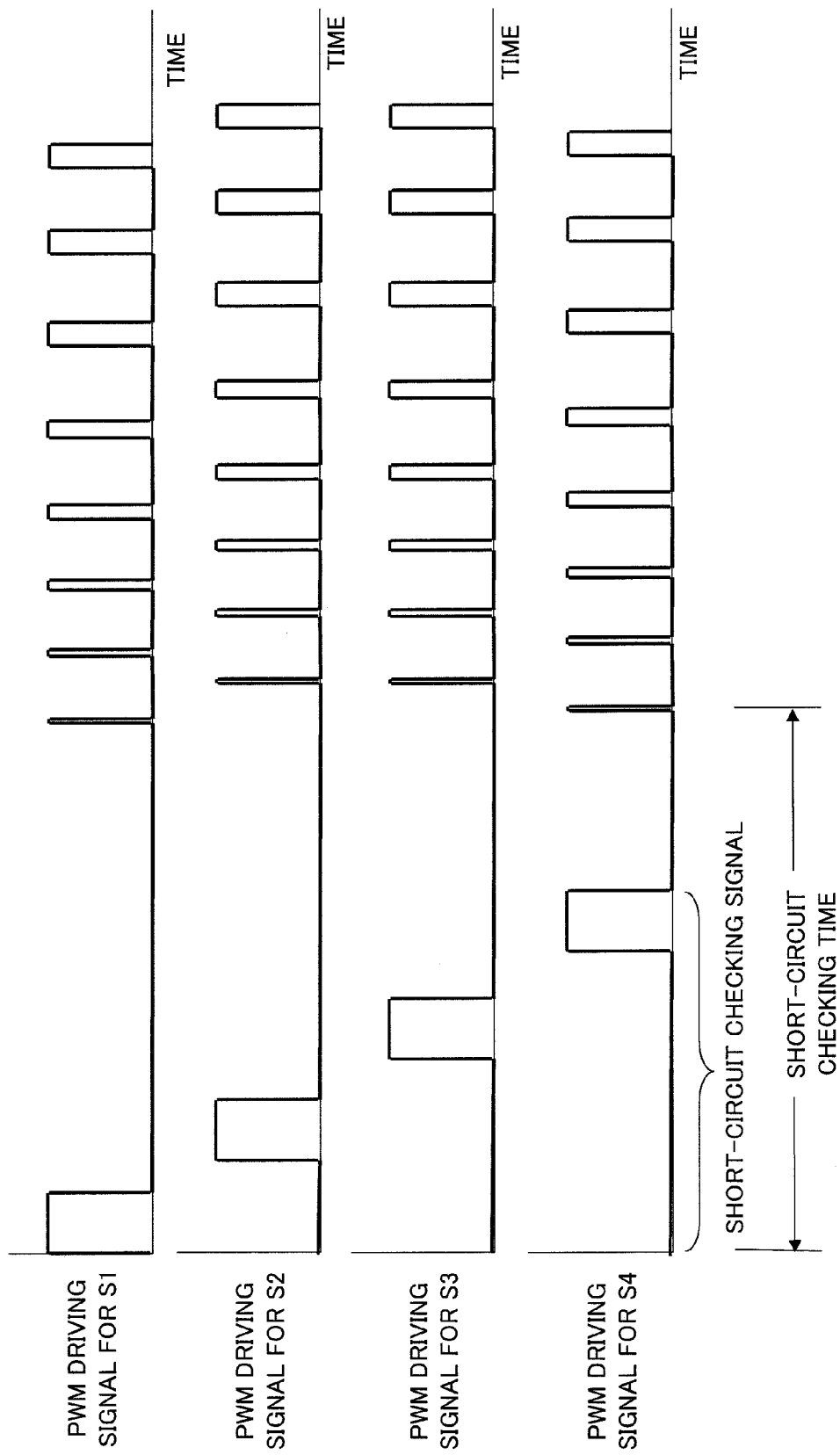
FIG. 4 is a time chart of a PWM driving signal which shows a first embodiment of PWM driving control according to the present invention.

FIG. 4 shows a PWM driving signal according to a first embodiment of the inverter device according to the present invention.

In FIG. 4, the PWM driving signal of each of the switching elements S1 to S4 represents a gate signal for driving each of the switching elements S1 to S4 constituting the full bridge inverter circuit 21 shown in FIG. 2. The PWM driving signal of each of the switching elements S1 to S4 has a PWM driving signal for checking short-circuit for each of the switching elements of the full bridge inverter circuit 21 constructed by the switching elements S1, S2, S3 and S4.

The short-circuit checking PWM driving signals shown in FIG. 4 have a fixed PWM width irrespective of an output condition. The short-circuit checking PWM driving signal is set to have a sufficiently larger width than a short-circuit detecting mask time as described in detail later.

With respect to the short-circuit checking PWM driving signal shown in FIG. 4, the short-circuit checking PWM driving signal for independently turning on each of the switching elements S1 to S4 constituting the full bridge inverter circuit 21 is successively inserted into the switching elements S1 to S4 in this order, whereby short-circuit trouble of each of the switching elements S1 to S4 can be checked.

That is, when only the switching element S1 of the full bridge inverter circuit 21 is turned on, no current flows through the switching element S1 because the switching element S2, the switching element S3 and the switching element S4 are turned off if they are under a normal state. Accordingly, no on-voltage occurs in the switching element S1 of the full bridge inverter circuit 21.

It is assumed that the switching element S2 of the full bridge inverter circuit 21 is under short-circuit trouble. In this case, when the switching element S1 of the full bridge inverter circuit 21 is turned on, the DC power source is short-circuited by the switching element S1 and the switching element S2 of the full bridge inverter circuit 21.

When short-circuit current flows through the switching element S1 and the switching element S2 of the full bridge inverter circuit 21, the on-voltage of the switching element S1 of the full bridge inverter circuit 21 increases abnormally.

In the case of this embodiment, the short-circuit checking PWM driving signal of each switching element of the full bridge inverter circuit 21 has a fixed PWM width irrespective of an output condition, and the PWM width of the short-circuit checking PWM driving signal of each switching element is set to be sufficiently longer than the short-circuit detecting mask time.

Therefore, abnormality can be detected by the short-circuit checking PWM driving signal of the switching element S1 of the full bridge inverter circuit 21, and thus the full bridge inverter circuit 21 can be safely stopped.

Accordingly, according to this embodiment, in the inverter device based on the simple PWM control, short-circuit can be detected even under such a load condition that the PWM driving signal is very small, and when the switching element of the inverter is under short-circuit trouble, CPU 100 receiving a short-circuit detection signal outputs a control signal for stopping the device to the PWM driving signal generating circuit 24, whereby the operation can be safely stopped.

Furthermore, according to this embodiment, the device having high reliability to a very broad load range can be provided by applying the inverter device of this invention to the X-ray high voltage device.

The output signal of the on-voltage detecting circuit 26 may be processed in CPU 100, and a normal state or an abnormal state of the switching elements S1 to S4 may be displayed by an alarm 70.

Second Embodiment

Figure 5:
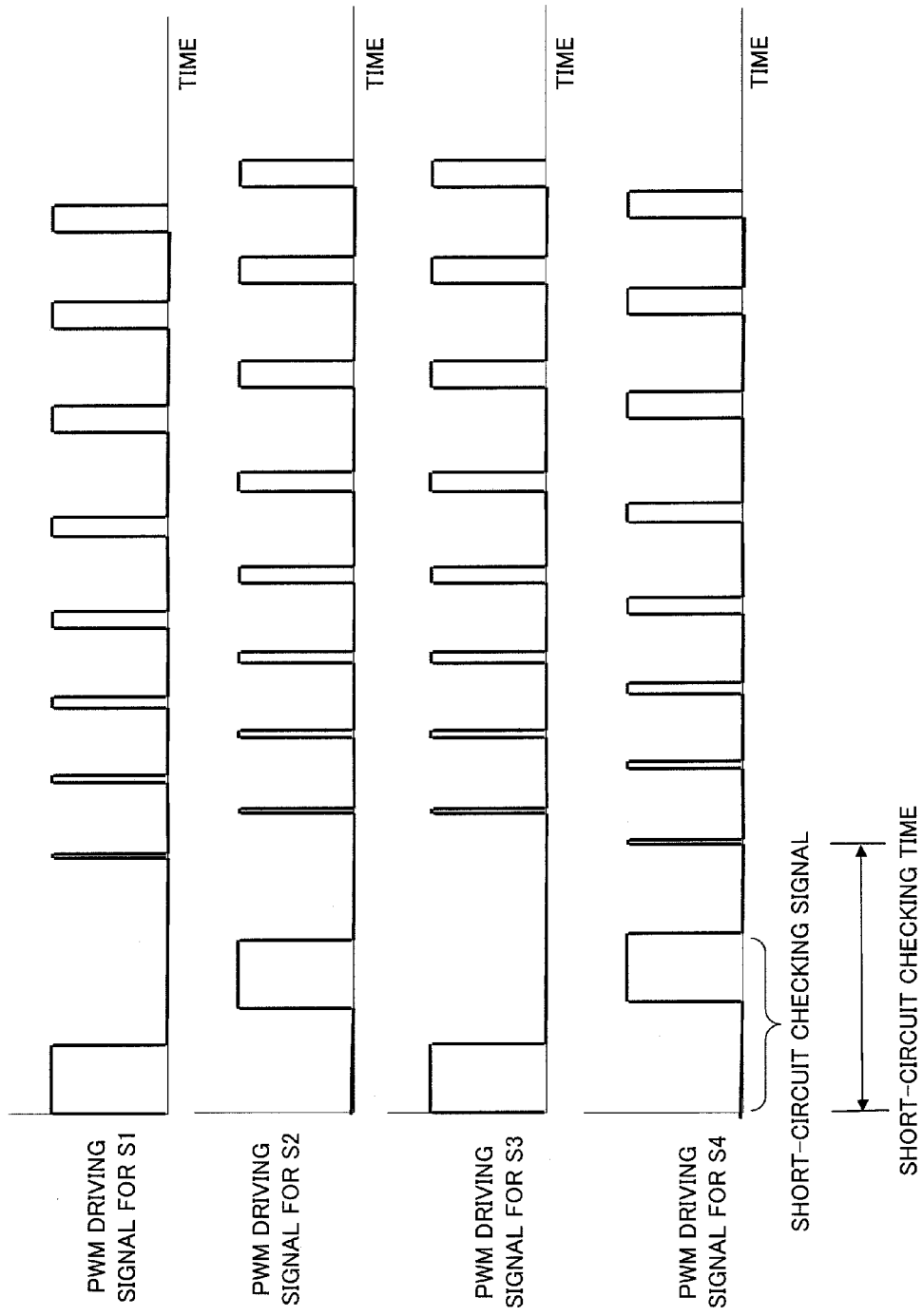
FIG. 5 is a time chart of a PWM driving signal which shows a second embodiment of PWM driving control according to the present invention.

FIG. 5 shows a PWM driving signal according to a second embodiment of the inverter device according to the present invention.

In FIG. 5, the PWM driving signal of each of the switching elements S1 to S4 represents a gate signal for driving each of the switching elements S1 to S4 constituting the full bridge inverter circuit 21 shown in FIG. 2. The PWM driving signal of each of the switching elements S1 to S4 has a short-circuit checking PWM driving signal for each switching element of the full bridge inverter circuit 21 comprising the switching elements S1, S2, S3 and S4.

In the second embodiment shown in FIG. 5, the short-circuit checking PWM driving signal of the switching element S1 constituting the full bridge inverter circuit 21 and the short-circuit checking PWM driving signal of the switching element S3 are generated at the same timing, and the switching element S1 and the switching element S3 are turned on at the same time.

In the second embodiment shown in FIG. 5, the short-circuit checking PWM driving signal of the switching element S2 constituting the full bridge inverter circuit 21 and the short-circuit checking PWM driving signal of the switching element S4 are generated at the same timing, and the switching element S2 and the switching element S4 are turned on at the same time.

The switching element S1 and the switching element S3 which are not connected to each other in series are simultaneously turned on and the switching element S2 and the switching element S4 are simultaneously turned on, whereby the total time to check short-circuit is shortened as compared with the first embodiment, and thus a time required until supply of power to a load by the inverter device is started can be shortened.

In a case where both the switching element S2 and the switching element S4 are normal, no voltage occurs at the output terminal of the inverter even when the switching element S1 and the switching element S3 are simultaneously turned on by the short-circuit checking PWM driving signal.

In a case where both the switching element S1 and the switching element S3 are normal, no voltage occurs at the output terminal of the inverter even when the switching element S2 and the switching element S4 are simultaneously turned on by the short-circuit checking PWM driving signal.

Third Embodiment

Figure 6:
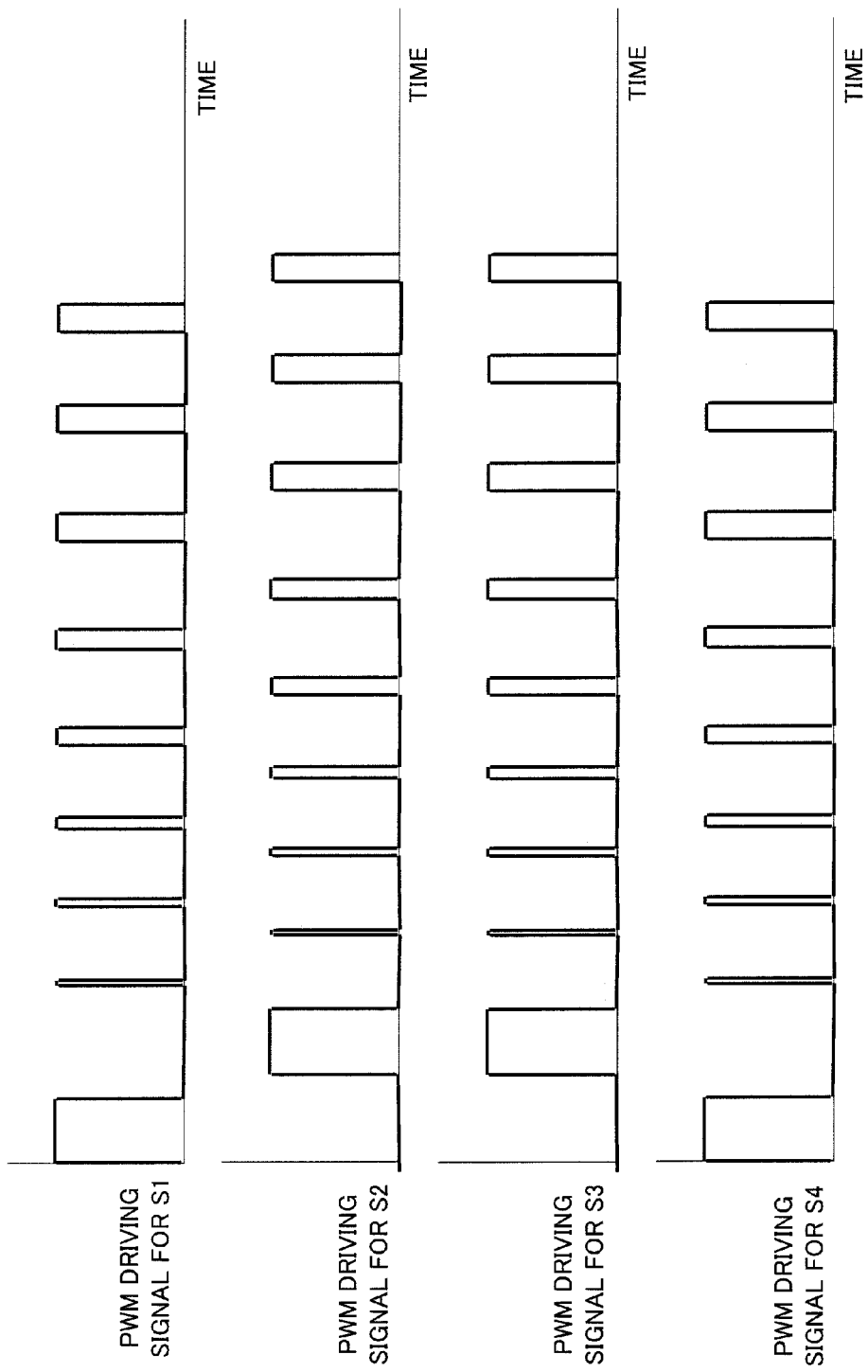
FIG. 6 is a time chart of a PWM driving signal which shows a third embodiment of PWM driving control according to the present invention.

FIG. 6 shows a PWM driving signal according to a third embodiment of the inverter device according to the present invention.

In FIG. 6, the PWM driving signal of each of the switching elements S1 to S4 represents a gate signal for driving each of the switching elements S1 to S4 constituting the full bridge inverter circuit 21 shown in FIG. 2. The PWM driving signal of each of the switching elements S1 to S4 has a short-circuit checking PWM driving signal for each switching element of the full bridge inverter circuit 21 comprising the switching elements S1, S2, S3 and S4.

In the third embodiment shown in FIG. 6, the short-circuit checking PWM driving signal for the switching element is applied according to an operation sequence of supplying power to the load of the full bridge inverter circuit 21. That is, the short-circuit checking PWM driving signal for the switching element S1 constituting the full bridge inverter circuit 21 and the short-circuit checking PWM driving signal for the switching element S4 are generated at the same timing to turn on the switching element S1 and the switching element S4 at the same time, and the short-circuit checking PWM driving signal for the switching element S2 and the short-circuit checking PWM driving signal for the switching element S3 are generated at the same timing to turn on the switching element S2 and the switching element S3 at the same time.

By simultaneously turning on the switching element S1 and the switching element S4 which are not connected to each other in series and also simultaneously turning on the switching element S2 and the switching element S3 which are not connected to each other in series, the total time for which the short-circuit checking PWM driving signal is generated is shortened as compared with the first embodiment, and a time required until supply of power to the load by the inverter device is started can be made early.

In the case of the first embodiment and the second embodiment, before the inverter device supplies power to the load, the short-circuit checking PWM driving signal is generated to check short-circuit of the switching element.

On the other hand, according to this embodiment, the short-circuit checking PWM driving signal for the switching element S4 is generated from the switching element S1 in the same sequence as the case where the inverter device 21 supplies power to the load.

However, with respect to only first one pulse, the PWM width is set to be sufficiently larger than the short-circuit detecting mask time.

Accordingly, according to this embodiment, there is no time for which the short-circuit checking PWM driving signal in the first embodiment and the second embodiment is generated, and thus there is an advantage that the time required until the inverter device 21 supplies power to the load is little different from that of the conventional device.

With respect to only the first one pulse, the switching element S1 and the switching element S4 or the switching element S2 and the switching element S3 which constitute the full bridge inverter circuit 21 are turned on with the PWM width which is sufficiently longer than the short-circuit detecting mask time, and thus supply of power to the load is starting. However, with respect to the inverter device having a switching frequency of several tens kHz, the short-circuit detecting mask time is set to 2 μs to 3 μs, and even when a PWM driving signal which is sufficiently longer than this short-circuit detecting mask time, for example, equal to 5 μs with respect to only the first one pulse is generated to drive the switching element, there occurs such a problem that the power is excessively output.

Figure 7:
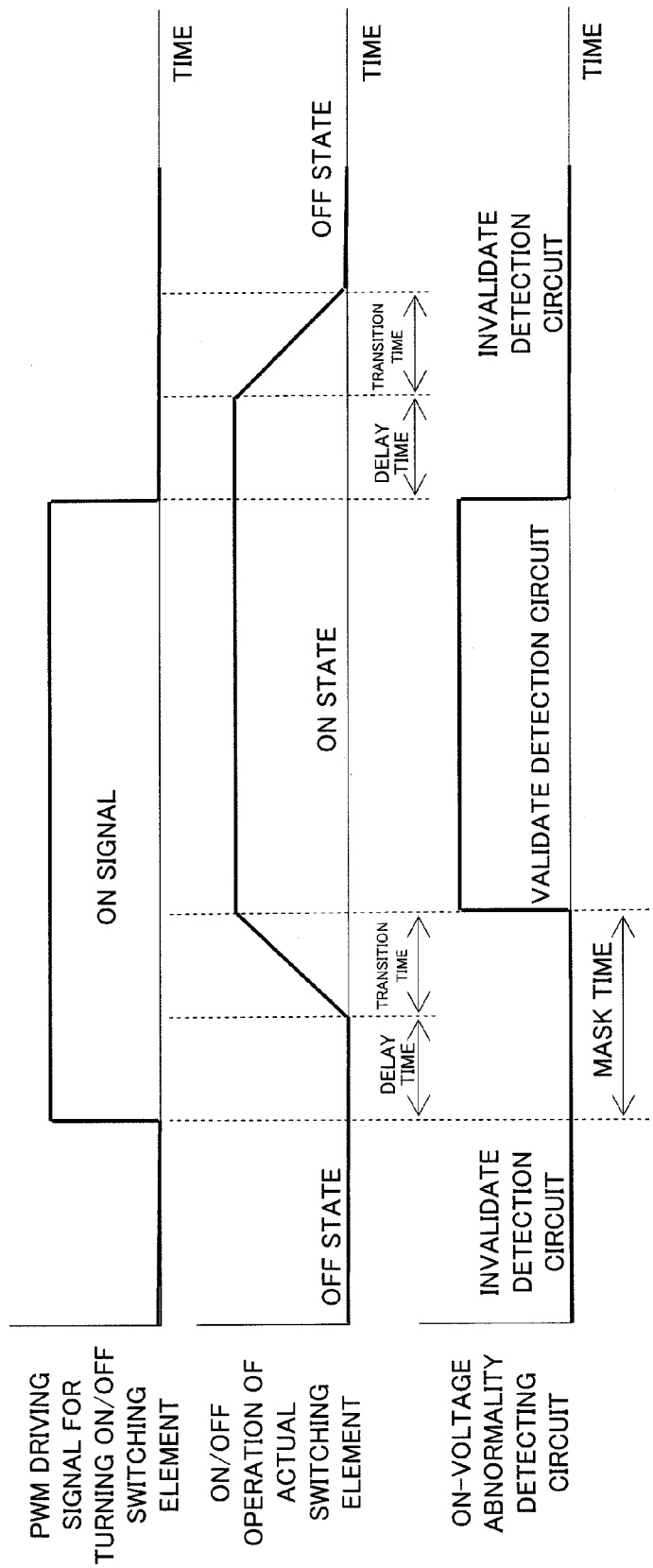
FIG. 7 is a diagram showing the relationship of the PWM driving signal for turning on/off a switching element, ON/OFF of the actual switching element and a detection effective range of an on-voltage abnormality detecting circuit.

FIG. 7 shows the relationship of the PWM driving signal for the operation controlled by CPU 100, that is, for turning on/off the switching element, the ON/OFF operation of the actual switching element and the detecting operation of the on-voltage detecting circuit 26.

As shown in FIG. 7, the switching element has a delay time and a transition time from the time when the PWM driving signal for controlling ON/OFF is supplied to the gate until the time when ON/OFF is actually performed. That is, the switching element starts the transition from an OFF state to an ON state after the PWM driving signal input to the gate is shifted from OFF (Low) to ON (High) and then the delay time elapses, and completes the transition to the ON state after a fixed transition time. This phenomenon is likewise applied to the case when the switching element is turned off.

Therefore, according to this invention, the on-voltage detecting circuit 26 for detecting overcurrent or short-circuit effectively operates after the PWM driving signal input to the gate is shifted from OFF (Low) to ON (High), so that the PWM driving on-signal is input to the gate, and then a mask time for masking a fixed time elapses.

Figure 8:
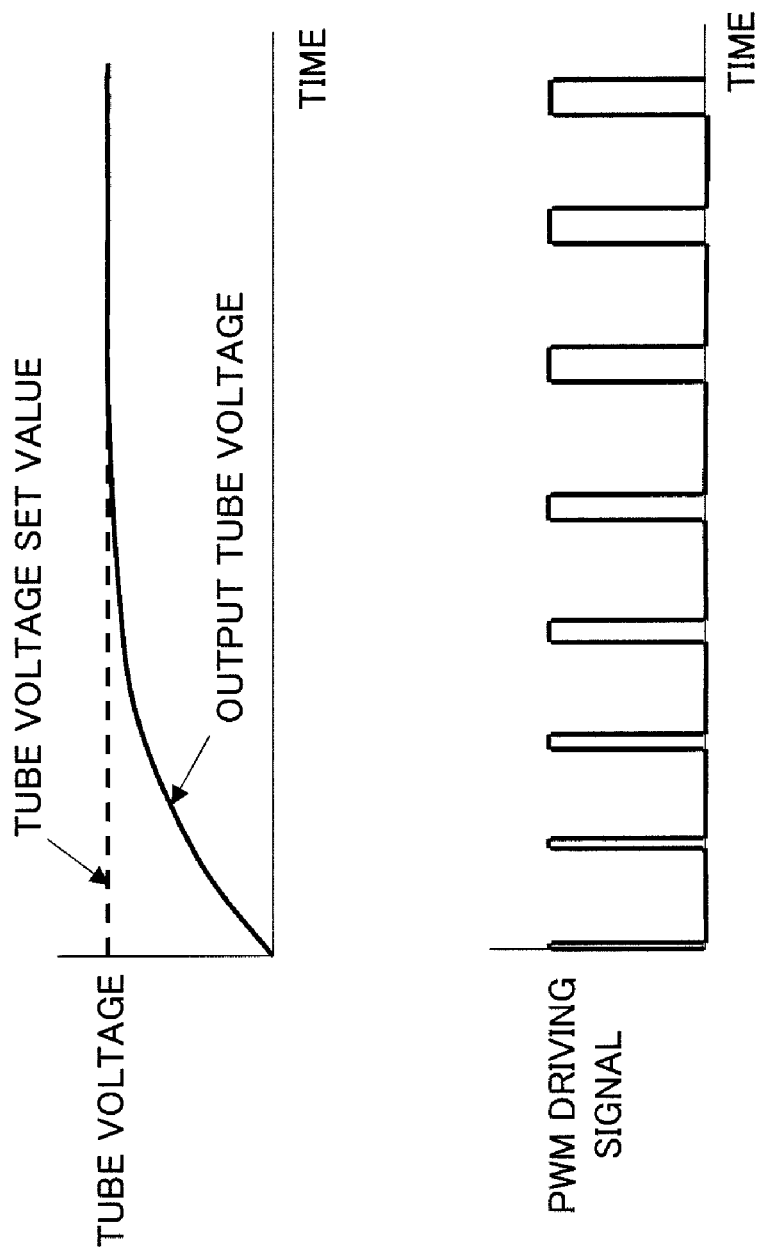
FIG. 8 is a diagram showing a conventional PWM driving signal.

Accordingly, it is difficult to detect abnormality in the embodiment shown in FIGS. 4 to 6 and within the pulse width of the initial PWM driving signal for starting supply of power from the inverter circuit to the load in FIG. 8. However, by adopting this embodiment of the present invention, abnormality (short-circuit) of the switching element can be detected.

The invention claimed is:

1. An inverter device comprising an inverter circuit that is constructed by plural switching elements, receives a PWM driving signal to be supplied to the switching elements to convert a DC voltage supplied from a DC power source to a high-frequency AC voltage and outputs the thus-converted high-frequency AC voltage; and control means for outputting the PWM driving signal to be supplied to each of the switching elements and controlling the output of the PWM driving signal, characterized by further comprising:
   means for supplying a PWM driving signal for detecting short-circuit of each switching element to each switching element before the inverter circuit receives a PWM driving signal for supplying power to a load, and
   means for detecting an on-voltage of a switching element which is serially connected to each switching element turned on when the switching element is turned on by the short-circuit detecting PWM driving signal, thereby detecting an overcurrent or short-circuit state of the switching element.

2. The inverter device according to claim 1, wherein the short-circuit detecting PWM driving signal has a pulse width longer than a short-circuit detecting mask time.

3. The inverter device according to claim 1, wherein the short-circuit detecting PWM driving signal is set to have a fixed pulse width irrespective of an output of the inverter circuit.

4. The inverter device according to claim 1, wherein the short-circuit detecting PWM driving signal successively and independently turns on the respective switching elements constituting the inverter circuit at different timings.

5. The inverter device according to claim 1, wherein the short-circuit detecting PWM driving signal simultaneously turns on plural switching elements that are not connected to one another in series among the switching elements constituting the inverter circuit.

6. The inverter device according to claim 1, wherein the short-circuit detecting PWM driving signal is set to have a pulse width that is sufficiently longer than a short-circuit detecting mask time with respect to a first pulse in the same sequence as a case where the inverter circuit supplies power to the load.

7. An X-ray high voltage device comprising a DC power source, an inverter device, a high voltage generating device, a rectifier and a smoothing capacitor, wherein DC voltage supplied from the DC power source is converted to a high-frequency AC voltage by the inverter device to output the thus-converted high-frequency AC voltage, the high-frequency AC voltage is converted to a high-frequency high voltage by the high voltage generating device to output the thus-converted high-frequency high voltage, the high-frequency high voltage is rectified by the rectifier and further smoothened by the smoothing capacitor to supply the rectified and smoothened voltage as a tube voltage to an X-ray tube, and the inverter device is constructed by the inverter device according to claim 1.

* * * * *